(12) United States Patent
Nihei et al.

(10) Patent No.: US 7,119,560 B2
(45) Date of Patent: Oct. 10, 2006

(54) PROBE APPARATUS

(75) Inventors: Makoto Nihei, Mitaka (JP); Yutaka Ueda, Mitaka (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 0 days.

(21) Appl. No.: 10/921,674

(22) Filed: Aug. 18, 2004

(65) Prior Publication Data

US 2005/0083073 A1    Apr. 21, 2005

(30) Foreign Application Priority Data

Aug. 21, 2003   (JP)   ............................. 2003-297630

(51) Int. Cl.
*G01R 31/02*   (2006.01)
(52) U.S. Cl. .................. 324/754; 324/750; 324/758
(58) Field of Classification Search ......... 324/750–764
See application file for complete search history.

(56) References Cited

U.S. PATENT DOCUMENTS

| | | | | |
|---|---|---|---|---|
| 4,856,904 A | * | 8/1989 | Akagawa | ............... 356/400 |
| 5,644,245 A | * | 7/1997 | Saitoh et al. | ............... 324/754 |
| 6,545,458 B1 | * | 4/2003 | Yamazaki | ............... 324/158.1 |
| 6,784,678 B1 | * | 8/2004 | Pietzschmann | ............... 324/758 |
| 6,927,587 B1 | * | 8/2005 | Yoshioka | ............... 324/754 |

FOREIGN PATENT DOCUMENTS

| | | |
|---|---|---|
| JP | 7-66249 | 3/1995 |
| JP | 7-161783 | 6/1995 |
| JP | 2000-68338 | 3/2000 |

OTHER PUBLICATIONS

Patent Abstract of Japan Publication No. JP7161783, Published Jun. 23, 1995 in the name of Abe Masaharu.

* cited by examiner

*Primary Examiner*—Vinh Nguyen
*Assistant Examiner*—Arleen M. Vazquez
(74) *Attorney, Agent, or Firm*—Christie, Parker & Hale, LLP

(57) ABSTRACT

A probe apparatus 1 includes displacement detection means 6 disposed on a surface 4a of a probe card 4 from which probing needles 41 of the probe card 4 protrude, and control means 5 for receiving a signal of a positional change of the probe card 4 from the displacement detection means or a positional change on the stage side, or signals of positional changes of both of them and moving a stage 2 in a Z axis direction. The displacement detection means detects on the real time basis the positional change of the probe card due to influences of heat, etc, moves the stage to correct the positional change and keeps the contact condition between probing needles of the probe card and electrode pads of a wafer 10 always constant.

4 Claims, 2 Drawing Sheets

PROBE APPARATUS

CROSS REFERENCE TO RELATED APPLICATION

This application claims the priority of Japanese Patent Application Number 2003-297630, filed on Aug. 21, 2003.

BACKGROUND OF THE INVENTION

1. Field of the Invention

This invention relates to a probe apparatus for inspecting electric characteristics of a plurality of semiconductor devices formed on a wafer. More particularly, the invention relates to a probe apparatus that can correct, on a real time basis, a positional change of a probe card, a positional change of a stage on which the wafer is put or the positional changes of both probe card and stage (contact position change) due to the influence of heat in case of inspecting in an environment such as high or low temperatures.

2. Description of the Related Art

A large number of semiconductor devices having the same electric element circuit formed therein are formed on a surface of a wafer. To inspect the electric characteristics of each electric element circuit before these electric element circuits are diced into individual semiconductor devices (chips), approval or rejection is judged by using a probe apparatus. The probe apparatus generally includes probing needles corresponding to each semiconductor device of the wafer and a probe card connected to a tester, and conducts electric measurement by bringing each probing needle into contact with each electrode pad of the semiconductor device while the probing needles are serially allowed to correspond to each semiconductor device of the wafer.

To conduct precise electric measurement, the probing needle of the probe card must be correctly brought into contact with the electrode pad of the semiconductor device. It is therefore necessary to control, very precisely, a stage on which the wafer is put and to correctly align the electrode pads to the probing needles before measurement is made. According to the prior art technology, a CCD camera is installed on the side of the stage on which the wafer is put, an alignment optical device is arranged at a position spaced apart from a test head to which the probe card having the probing needles is removably fixed, the distal end position of each needle is imaged and detected by the CCD camera while the wafer position and the chip pattern on the wafer are recognized by the alignment optical device and positioning between the electrode pad of a specific semiconductor device on the wafer and the probing needle is conducted by image processing, or the like.

It has been necessary in recent years to test the durability of the semiconductor devices and to test them in accordance with a use condition. Therefore, the test measurement of the semiconductor devices has been made in various measurement environments ranging from a high temperature environment of about 200° C. to a low temperature environment of about −55° C. In a probe apparatus in which a test measurement is made under a high temperature condition while a chuck mechanism of a wafer is heated, for example, a probe card so arranged in the proximity of the chuck mechanism as to oppose the chuck mechanism undergoes thermal expansion due to radiated heat from the chuck mechanism. However, because the probe card of the prior art is fixed at its periphery by a card retaining member, the probe card undergoes deformation in such a manner as to warp, as a whole, when thermal expansion occurs. When a measurement is repeated, deformation occurs in the probe card due to the contact pressure between the probing needle and the electrode pad. When the chuck (stage) portion is heated or cooled, the position of the chuck (stage) upper surface changes, too. Therefore, the contact position between the probing needle of the probe card and the electrode pad of the semiconductor pad deviates from the position of positioning before the measurement and their contact becomes insufficient. In consequence, the test measure cannot be made with high accuracy or the electrode pad is damaged due to an excessively strong contact.

FIG. 3 shows a change with time of the probe card from its normal temperature condition to its high temperature stable condition, that is, a typical example of the contact position change between the probing needle and the electrode pad with the passage of time. In other words, even when the contact position under the normal temperature condition is set to the reference position (zero position), the probe card, etc, undergoes thermal expansion due to the thermal influences under the measurement environment, the error of the contact position becomes drastically greater and the contact position change thereafter settles gradually to a stable condition.

To solve the problem of the contact position change due to heat, etc, counter-measures have been taken in the past by changing the material of a card holder of the probe card to the one that is not easily affected by heat under the measurement environment, or by measuring the probe position during the measurement to measure the positional change of the probe card (contact position change), or by starting the measurement after the probe card becomes thermally stable from the normal temperature condition to the temperature (high or low temperature) of the measuring environment.

However, the change of the material of the card holder to the material that is not easily affected by the influences of heat involves the problem that the material cost and the production cost increase.

When the distal end position of each probing needle is measured during the measurement and the contact position is corrected, the probing needle position must be confirmed by the CCD camera on the stage side. Therefore, as the probing needle is measured while being spaced apart from the heat source (stage), the measurement is conducted at a lower temperature than the temperature of the contact condition between the probing needle and the electrode pad, so that an accurate measurement result cannot be obtained. Because the distal end position of the probing needle must be re-measured while the probing needle is separated from the electrode pad every time, correction of the contact position is time-consuming.

Furthermore, when the measurement is started after the probe card is thermally stabilized, the through-put of the test measurement of the semiconductor devices drops and work efficiency becomes lower.

To detect the contact condition of the probing needle, the following technologies are known. The first technology detects variance of the tips of the probing needles by means of a laser beam and sets an optimum over-drive amount in accordance with this variance so that each probing needle can come into contact with the electrode pad at a suitable pressure (for example, Japanese Unexamined Patent Publication No. 7-161783). The second technology brings the probing needle into contact with the electrode pad, measures the capacitance between the electrodes so as to judge approval/rejection of the contact and controls the UP/DOWN distance of the wafer (for example, Japanese Unexamined Patent Publication No. 2000-68338). The third technology detects the contact condition between the probing needle and the electrode pad and corrects the fitting position of the probe card by means of a tilt/height adjustment mechanism (for example, Japanese Unexamined patent Publication No. 7-66249).

However, the technology of Japanese Unexamined Patent Publication No. 7-161783 does not detect, on a real time basis, the positional change of the probe card due to heat but detects the tip position of the probing needle while the probing needle is separated from the heat source (stage) in the same way as the technology described above that confirms the probing needle position by the CCD camera on the stage side. Therefore, a correct position measurement result cannot be obtained in a contact condition between the probing needle and the electrode pad. The technologies of Japanese Unexamined Patent Publication No. 2000-68338 and No. 7-66249 use the probe itself as the detection means. Therefore, the apparatus is likely to become complicated in construction and large in scale when hundreds or thousands of probing needles exist as in the case of a collective contact for measuring a single wafer by a single contact that has become the target in recent years.

SUMMARY OF THE INVENTION

In view of the problems described above, the invention aims at providing a probe apparatus capable of measuring, on a real time basis, a positional change of a probe card or the positional change of a stage on which a wafer is put (contact position change), correcting the probing needle position of the probe card (stage position) and conducting a test measurement of semiconductor devices under a contact condition while a relative distance between a chuck and a probe tip of the probe card is kept within a constant or allowable range.

A probe apparatus according to the invention includes displacement detection means for detecting displacement of the position of a probe card, disposed on a surface of the probe card and control means for moving a stage supporting thereon the wafer in a Z axis direction in accordance with a signal from the displacement detection means, wherein the stage is moved and corrected in the Z axis direction in accordance with detection of displacement of the position of the probe card from the wafer by the displacement detection means so that a contact condition between the probing needle of the probe card and an electrode pad of semiconductor devices can be always kept within a constant or allowable range. Consequently, the positional change of the probe card (contact position change) due to heat, etc, can be detected on a real time basis and its position can be corrected. Therefore, the contact condition between the probing needle and the electrode pad can always be kept within a constant or allowable range under various measurement environments and measurement can be efficiently carried out within high accuracy and within a short time.

The probe apparatus according to the invention can use either a contact type displacement sensor or a non-contact type displacement sensor for the displacement detection means.

The probe apparatus according to the invention may use a tester for the control means. This shows that the tester is utilized as the control means without using a control portion originally inherent to the probe apparatus as the control means.

The present invention may be more fully understood from the following description of preferred embodiments thereof set forth below together with the accompanying drawings.

DESCRIPTION OF THE PREFERRED EMBODIMENTS

A probe apparatus according to an embodiment of the invention will be hereinafter explained with reference to the drawings.

Figure 1:
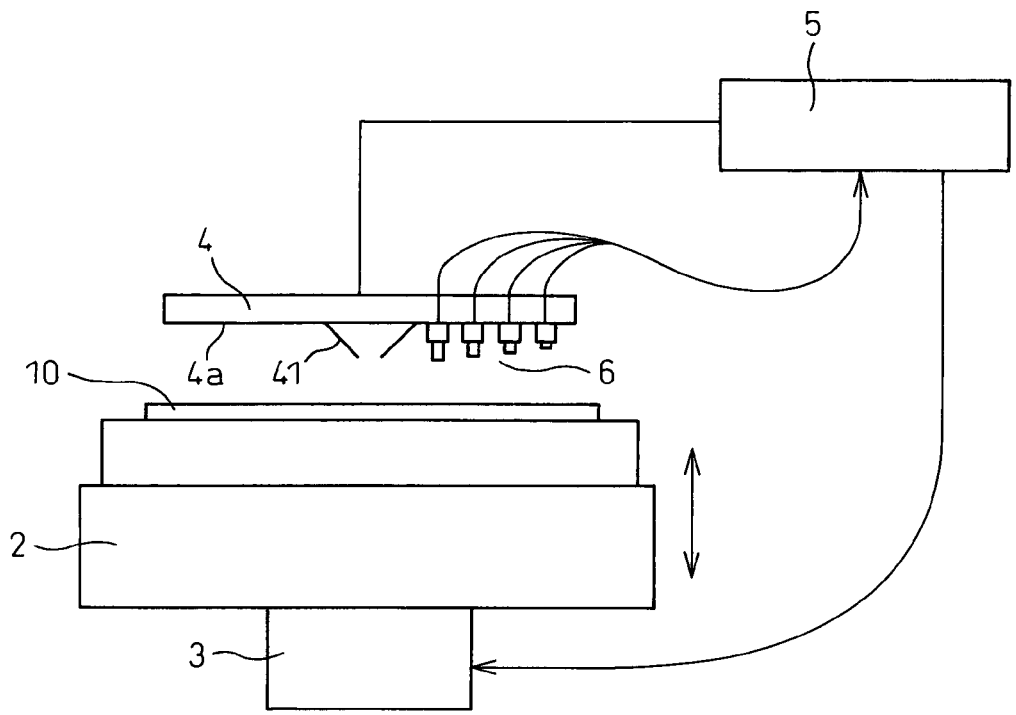
FIG. 1 schematically shows an overall construction of a probe apparatus according to an embodiment of the invention.

FIG. 1 schematically shows an overall construction of the probe apparatus according to the embodiment of the invention. The probe apparatus 1 includes a stage 2, a stage driving mechanism 3, a probe card 4 having probing needles 41, a tester 5 and displacement detection means 6.

A stage 2 having a chuck mechanism for placing and holding a wafer 10 is so constituted by the stage driving mechanism 3 controlled by the tester 5 and a control portion (not shown) as to be capable of moving in X, Y and Z directions and a θ rotation direction the center of which lies in a Z axis and can thus three-dimensionally move the wafer 10.

A large number, that is, hundreds or thousands, of bump-like electrode pads (not shown in the drawing) are formed on the surface of a large number of semiconductor devices formed on the wafer 10. Probing needles 41 corresponding to the electrode pads of each semiconductor device of wafer 10 are provided to the probe card 4. Therefore, electric characteristics of each semiconductor device can be inspected by bringing the probing needle 41 of the probe card 4 connected to the tester 5 into contact with the electrode pad of the wafer 10.

Incidentally, the probe apparatus 1 according to the invention, too, has alignment means for positioning the probing needle 41 of the probe card 4 to the electrode pad of the wafer 10 in the same way as the prior apparatus not shown in the drawing. In other words, a CCD camera for imaging, from below, the probing needles 41 and for detecting the distal end position of each probing needle is fitted to the stage 2. The stage 2 is moved to move the CCD camera and to measure the distal end of each probing needle while adjusting the focus and the result is inputted to the control portion. An alignment optical apparatus, inclusive of an imaging means such as the CD camera, is also provided, recognizes the pattern of the semiconductor devices on the wafer 10 and inputs the result to the control portion. The control portion can thus execute automatically the positioning operation between the distal end of each probing needle 41 and each electrode pad by using a known image processing technology on the basis of the information obtained from the alignment optical apparatus and the position information of the distal end of probing needle 41 acquired by the CCD camera of the stage 2.

Figure 2:
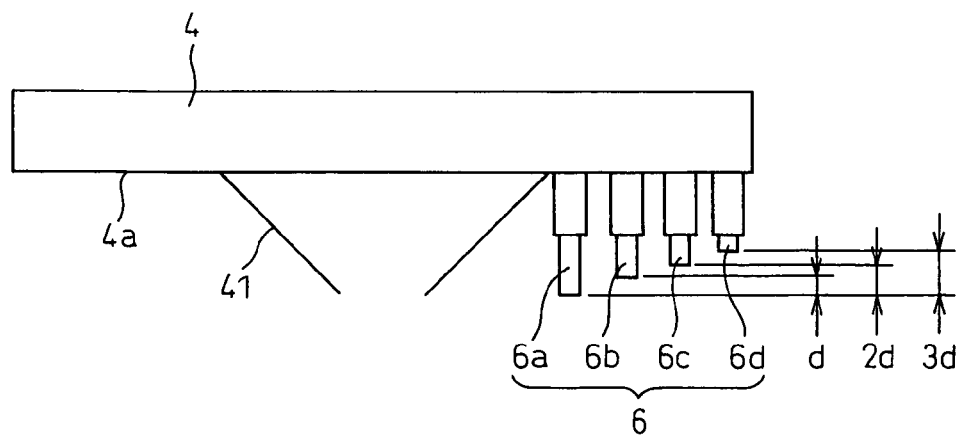
FIG. 2 is an enlarged view of a probe card having displacement detection means.
Figure 3:
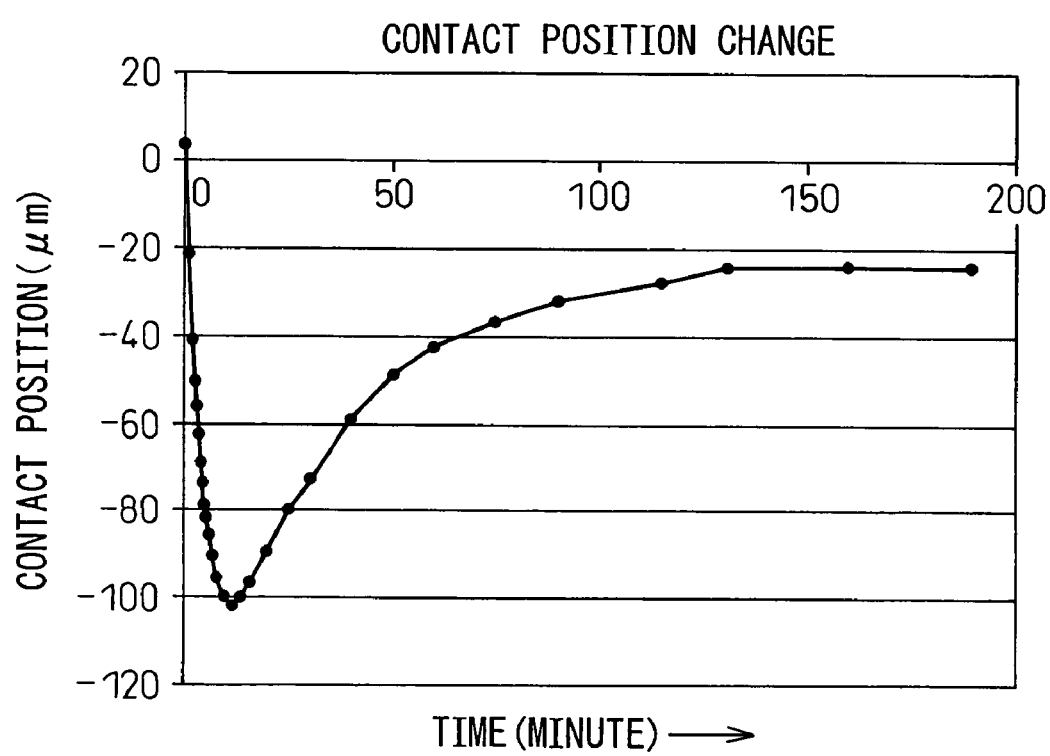
FIG. 3 shows an example of displacement of a probe card with time until the probe card reaches a high temperature stable condition from a normal temperature state.

The probe apparatus 1 according to the invention further includes displacement detection means 6 for detecting a positional change (contact position change) of the probe card 4 due to influences of heat from the stage and a contact pressure between the probing needle 41 and the electrode pad and control means 5 for correcting the positional change detected by the displacement detection means 6 by moving the stage 2 in the Z axis direction, whereby each of these means constitutes the feature of the invention. In other words, as shown in enlargement in FIG. 2, a plurality of contact type displacement sensors 6a, 6b, 6c and 6d as the displacement detection means 6 is disposed on a surface 4a on the side in which the probing needle 41 of the probe card 4 protrudes (a surface opposing the wafer 10 on the stage 2). These contact type displacement sensors 6a to 6d are touch sensors that output ON/OFF signals while the installation height is changed by d=10 μm, for example. In FIGS. 1 and 2, these contact type displacement sensors 6a to 6d are disposed at mutually different positions in a radial direction from the center. In order to precisely detect the positional change of the probe card 4, however, these sensors 6a to 6d are preferably disposed on the same radius with gaps among them. Incidentally, four contact type displacement sensors 6a to 6d are shown disposed in FIGS. 1 and 2 but the number is not particularly limited to four. To determine the allowance range of the positional change of the probe card 4, however, at least two contact type displacement sensors are preferably disposed to represent a minimum allowance value and a maximum allowance value.

Referring to FIG. 1, the detection signals (ON/OFF signals) representing the contact height from the contact type displacement sensors 6a to 6d disposed on the probe card 4 are inputted to the tester 5 as the control means. The tester 5 outputs an output signal to the stage driving mechanism 3 on the basis of this detection signal and the stage 2 moves in the Z axis direction, thereby correcting the positional change of the probe card 4. Incidentally, the tester 5 is utilized as the control means for the positional change of the probe card 4 in FIG. 1 but a new control portion may well be disposed in place of the tester 5.

The probe apparatus 1 of the invention having the construction described above operates in the following way.

When the probe card 4 is in the normal condition in which it is not affected by heat or the like, the probing needles 41 of the probe card 4 and the electrode pads exist at the initial contact position that is positioned by the alignment means. The probe card 4 represents the reference position (zero position) and, in this condition, only the contact type displacement sensor 6a keeps contact with the wafer 10 and outputs the ON signal but other contact type displacement sensors 6b to 6d remain OFF.

As the positional change of the probe card 4 thereafter proceeds due to the influences of heat or the like, the contact type displacement sensors 6b and 6c serially output the ON signals. When the tester 5 receives the ON signal from the contact type displacement sensor 6d as the allowance limit of the positional change, the tester 5 transmits the output signal to the stage driving mechanism 3, drives the stage 2 and corrects the positional change (contact position change) of the probe card 4. The contact condition between the probing needles 41 and the electrode pads is always kept within a constant or allowable range. In other words, the contact condition between the probing needles and the electrode pads is normally managed by the over-drive amount and this over-drive amount of the probe 41 is kept within the allowable range.

In this case, the correction operation of the respective positional change may be conducted at the point at which the contact type displacement sensors 6b and 6c output the ON signals.

It is further possible to set the condition in which the probe card 4 exists at the reference position to the condition in which all the contact type displacement sensors 6a to 6d and to serially turn OFF the contact type displacement sensors 6a to 6d as the positional change of the probe card 4 proceeds.

As described above, the positional change of the probe card 4 due to heat or the like is detected in this way on the real time basis and is corrected and the contact condition between the probe 41 of the probe card 4 and the electrode pad can be always kept within the constant or allowable range. Therefore, the contact position can be corrected without lowering work efficiency. Because the contact condition is, as such, measured, the measurement accuracy can be improved.

Incidentally, the embodiment explained above uses touch sensors, that is, the contact type displacement sensors 6a to 6d, as the displacement detection means 6 of the positional change of the probe card 4 but non-contact type displacement sensors may be used in place of the contact type displacement sensors. Known sensors such as a sensor using a laser beam, a sensor using a ultrasonic wave, a sensor using an eddy current, a sensor using an electrostatic capacity, and so forth, can be used as the non-contact type displacement sensor. In short, it is possible to use those sensors the displacement detection means of which can detect or measure the gap between the probe card and the wafer put on the stage. The embodiment described above utilizes the tester 5 as the control means but the control portion of the stage driving mechanism 3 originally inherent to the probe apparatus 1 may be used as the control means, as well.

As explained above, the probe apparatus according to the invention can measure, on a real time basis, the positional change of the probe card (contact position change) under various measurement environments such as high or low temperatures while the probing needle and the electrode pad keep contact with each other, can correct the position of the probing needle (position of the stage) and can always conduct the test measurement of the semiconductor device under the contact condition within the constant or allowable range. Therefore, the test measurement of the semiconductor device can be carried out without waiting for stabilization of the positional change of the probe card, work efficiency can be improved and damage of the probe card itself and the semiconductor device by the change of the contact pressure resulting from the positional change can be prevented. In addition, because the change of the probe position of the probe card need not be confirmed during the measurement, through-put can be improved.

While the invention has been described in detail with reference to a specific embodiment chosen for purposes of illustration, it would be obvious to those skilled in the art that various changes and modifications could be made thereto without departing from the basic concept and scope of the invention.

The invention claimed is:

1. A probe apparatus for positioning a wafer having semiconductor devices formed thereon and then bringing probing needles of a probe card into contact with electrode pads of said semiconductor devices to inspect their electric characteristics, said probe apparatus comprising:

displacement detection means for detecting displacement of the position of said probe card, disposed on a surface of said probe card from which said probing needles of said probe card protrude, said displacement detection means having a plurality of displacement sensors which are disposed at mutually different distances in a radial direction from a center of said probe card; and control means for moving a stage supporting thereon said wafer in a Z axis direction in accordance with a signal from said displacement detection means;

wherein said displacement detection means detects displacement of said probe card, put on said stage, from said wafer, corrects and moves said stage in the Z axis direction in accordance with displacement of the detected position so that a contact condition between said probing needles and said electrode pad can be always kept inside a constant or allowable range.

2. A probe apparatus as defined in claim 1, wherein said displacement sensors are contact type displacement sensors.

3. A probe apparatus as defined in claim 1, wherein said displacement sensors are non-contact type sensors.

4. A probe apparatus as defined in claim 1, wherein said control means is a tester.

* * * * *